(12) United States Patent
Traub

(10) Patent No.: US 6,696,842 B2
(45) Date of Patent: Feb. 24, 2004

(54) ELECTRONIC UNIT FOR DETECTING THE CHARGING CONDITION AND/OR THE WEAR OF A MOTOR VEHICLE BATTERY USING THE ENGINE ROTATIONAL SPEED AND BATTERY VOLTAGE

(75) Inventor: Florian Traub, Olching (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 0 days.

(21) Appl. No.: 10/089,117

(22) PCT Filed: Jul. 17, 2001

(86) PCT No.: PCT/EP01/08215

§ 371 (c)(1),
(2), (4) Date: Jul. 25, 2002

(87) PCT Pub. No.: WO02/08777

PCT Pub. Date: Jan. 31, 2002

(65) Prior Publication Data

US 2003/0076108 A1 Apr. 24, 2003

(30) Foreign Application Priority Data

Jul. 26, 2000 (DE) .......................... 100 36 341

(51) Int. Cl.⁷ ............................................ G01N 27/416
(52) U.S. Cl. ....................................................... 324/426
(58) Field of Search ................................. 320/104, 132, 320/134, 136, 426, 427, 430, 431, 433

(56) References Cited

U.S. PATENT DOCUMENTS

| 5,585,717 A | * 12/1996 | Eriksson et al. |
| 6,396,165 B1 | * 5/2002 | Nagano et al. |
| 6,404,163 B1 | 6/2002 | Kapsokavathis et al. |

FOREIGN PATENT DOCUMENTS

| DE | 43 41 826 | 6/1994 |
| DE | 198 31 723 | 1/2000 |
| JP | 60-105978 | 6/1985 |
| JP | 60-140163 | 7/1985 |
| JP | 03-243876 | 10/1991 |

* cited by examiner

Primary Examiner—Edward H. Tso
(74) Attorney, Agent, or Firm—Crowell & Moring LLP

(57) ABSTRACT

The invention relates to an electronic unit for identifying the charged state and/or the wear and tear of a motor vehicle battery. Said unit comprises elements for detecting the battery voltage and in addition, elements for detecting the speed of the internal combustion engine. The unit also has elements for evaluating the battery voltage according to the internal combustion engine speed during the starting operation, in relation to the charged state and/or the wear and tear of the motor vehicle battery.

2 Claims, 1 Drawing Sheet

Figure 1:
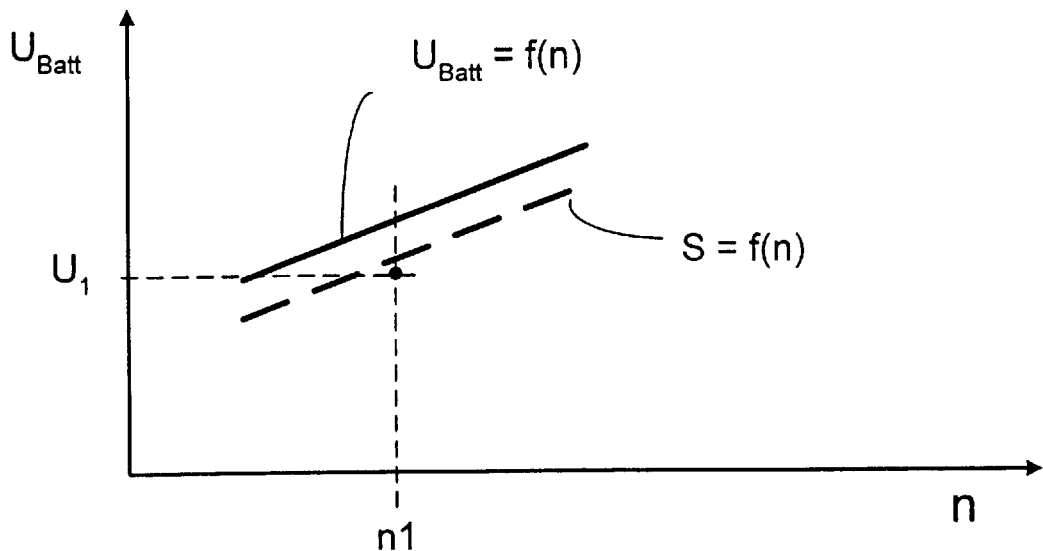

ELECTRONIC UNIT FOR DETECTING THE CHARGING CONDITION AND/OR THE WEAR OF A MOTOR VEHICLE BATTERY USING THE ENGINE ROTATIONAL SPEED AND BATTERY VOLTAGE

The invention relates to an electronic unit and to the method for detecting the charging condition and/or the wear of a motor vehicle battery according to the preamble of claim 1.

Many methods of determining the charging condition and/or the wear of a motor vehicle battery are known. For example, in German Patent Documents DE 37 12 629 A1 or DE 43 41 826 A1, it is suggested to derive the battery condition from the voltage break caused by the starter current. For this purpose, it is suggested to measure the battery current. From German Patent Documents DE 198 31 723 A1 and DE 44 06 193 A1, it is known to derive the battery condition from the voltage break caused by the starter current without measuring the battery current. In this case, particularly only the battery voltage and the battery temperature or internal-combustion engine temperature are taken into account. Furthermore, a charging condition determination by means of a quiescent voltage measurement is known.

All methods using a battery current measurement are relatively precise. However, since the battery current, particularly in large internal-combustion engines in motor vehicles, may amount to more than 1,000 A, very high-expenditure and expensive measuring systems are required which, in addition, have to permit a high time resolution. The precision of the methods without a battery current measurement is very low.

It is therefore an object of the invention to improve a system and a method respectively for detecting the charging condition and/or the wear of a motor vehicle battery of the initially mentioned type with respect to the costs and the precision.

This object is achieved by means of the characteristics of claims 1 and 4 respectively with respect to the device and the method. Advantageous further developments of the invention are the objects of the dependent claims.

The invention is based on the recognition that the battery voltage or the battery voltage break during a starting operation depends, particularly, on the drag moment of the internal-combustion engine. The drag moment, and thus the starter current or battery current, is subjected to influences by the temperature and manufacturing tolerances, but also changes by wear, equipment variants or insufficient maintenance. As determined empirically, all these quantities, similarly to affecting the battery current, also affect the rotational speed of the internal-combustion engine.

According to the invention, particularly an analysis of the battery voltage takes place as a function of the rotational speed of the internal-combustion engine during the starting operation with respect to the charging condition and/or the wear of the vehicle battery. The rotational speed of the internal-combustion engine can be digitally transmitted, for example, by way of a data bus (such as a CAN bus) which connects an internal-combustion engine control unit with the electronic unit. However, the electronic unit may also be part of a control unit of the internal combustion engine or of another control unit which itself detects and analyzes the rotational speed of the internal-combustion engine anyhow. In the electronic unit, a table, a characteristic curve or a characteristic diagram, for example, can be stored which assign a charging condition value and/or a wear value to the rotational-speed dependent battery voltage values. In this case, for example, the battery temperature can also be taken into account. However, in each case, no current measurement is carried out. The current as such therefore does not have to be measured in the case of this invention. Nevertheless, by taking into account the rotational speed of the internal-combustion engine, a high precision is achieved because, as determined empirically, the rotational speed of the internal-combustion engine acts, to a sufficiently precise degree, proportional to the current consumed by the starter.

As a further development of the invention, a preferably variable voltage threshold is defined as a function of the rotational speed of the internal-combustion engine. A poor charging condition and/or a high wear of the motor vehicle battery is/are detected when the battery voltage is below this voltage threshold within a defined time window, preferably at a defined point in time.

As a further development of the invention, the charging condition is also detected by a quiescent voltage measurement before the starting operation in order to be able to differentiate by means of the analysis of this quantity between a poor charging condition and a high wear when, during the starting operation, the battery voltage is below the defined voltage threshold. A poor charging condition is detected when previously there was a falling below a defined quiescent voltage threshold. A high wear is detected when previously the defined quiescent voltage threshold was exceeded.

As a result of the invention, a high-expenditure and expensive measuring of the battery current or of the current consumed by the starter during the starting operation can be eliminated. In comparison to all known methods without a battery current measurement, a clearly improved precision can be achieved. An automatic adaption of the method is achieved to different equipment variants of a vehicle (automatic transmission, air conditioner, type of internal-combustion engine) which have an effect on the drag moment of a vehicle. An adaption method shown, for example, in German Patent Document DE 197 50 309 can therefore be eliminated because these effects all enter into the course of the rotational speed of the internal-combustion engine.

The drawing illustrates an embodiment of the invention.

Figure 2:
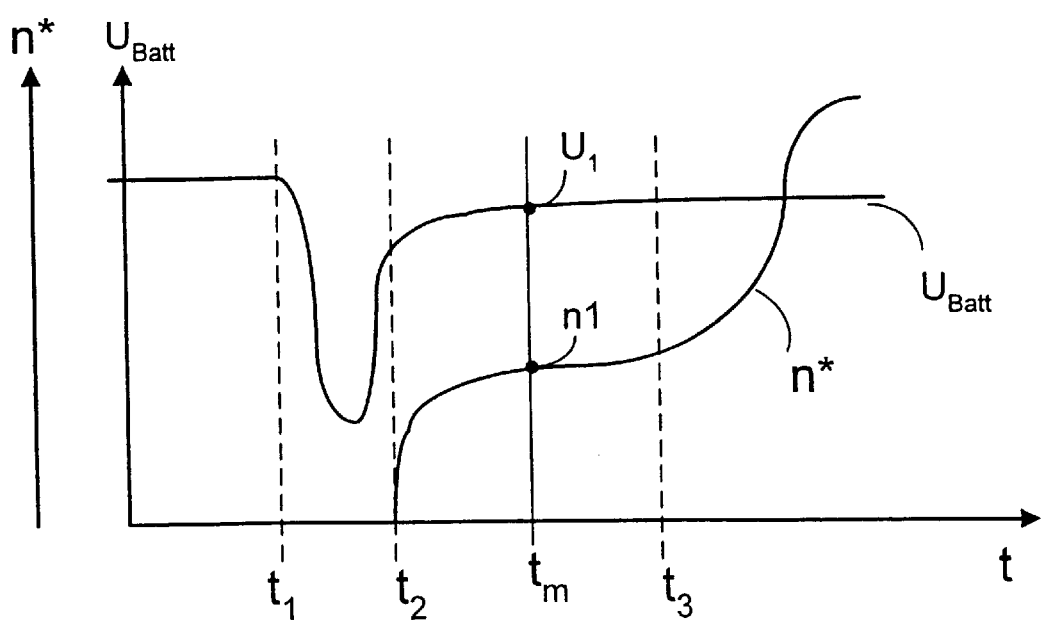

FIG. 1 is a definition according to the invention of a variable voltage threshold for the battery voltage which is dependent on the rotational speed of the internal-combustion engine; and FIG. 2 is a view of the measurement of the battery voltage at a defined point in time.

In FIG. 1, rotational speed n of the internal-combustion engine is plotted on the abscissa and the battery voltage $U_{Batt}$ is plotted on the ordinate. FIG. 1 illustrates, by means of the solid line, the empirically determined relationship between the battery voltage $U_{Batt}$ measured at a certain point in time (for example, $t_m$) during many starting operations and the isochronously detected rotational speed n of the internal-combustion engine for an intact motor vehicle battery. Such a course is stored, for example, as an optimal characteristic curve in the electronic unit for implementing the method according to the invention. This relationship could also be stored as a characteristic diagram while additionally taking into account the battery temperature. The broken line illustrates the corresponding definition of a voltage threshold $S=f(n)$ in the form of a tolerance band dependent on the rotational speed n of the internal-combustion engine. Above the threshold S, the motor vehicle battery can still be considered to be intact. A rotational-speed-dependent battery voltage value $U_{Batt}$ below the threshold S points to a poor charging condition or to a high wear.

In FIG. 2, the time t is plotted on the abscissa, and the battery voltage $U_{Batt}$, on the one hand, and the rotational speed value n* of the internal-combustion engine, on the other hand, are plotted on the ordinate. The rotational speed value n* of the internal-combustion engine corresponds to the digital and optionally smoothed value of the measured rotational speed n of the internal-combustion engine transmitted by the data bus. FIG. 2 shows the course of the battery voltage $U_{Batt}$ as well as the course of the rotational speed n of the internal-combustion engine in the form of the values n*, particularly during the starting operation. At the point in time $t_1$, the starter is started; at the point in time $t_2$, the rotational speed n or n* of the internal-combustion engine starts to rise in a detectable manner starting from zero [1/min]; and at the point in time $t_3$, the internal-combustion engine starts to run up under its own force. Within the time window of $t_2$ to $t_3$, here at the point in time $t_m$, the battery voltage $U_{Batt}$, and isochronously the rotational speed n or n* of the internal-combustion engine is detected. The point in time $t_m$ can be defined by a fixed time period after the point in time $t_2$.

At the point in time $t_m$, the value $U_1$ is obtained for the battery voltage $U_{Batt}$, the value n1 is obtained for the rotational speed n* of the internal-combustion engine. By means of this value pair $U_1$, n1, a comparison with the threshold S in FIG. 1 takes place. Because the battery voltage $U_1$ for the rotational speed value n1 of the internal-combustion engine is below the threshold value S=f(n), either a poor charging condition or a high wear is present. If the charging condition of the battery before the starting operation is known on the basis of a quiescent voltage measurement, a differentiation can be made as to whether the battery voltage during the starting operation was too low because of its wear or whether its charging condition was insufficient (not shown here). It is concluded, for example, that the charging condition is poor if previously there was a falling-below a defined quiescent voltage threshold. It is concluded that the wear is high if previously the defined quiescent voltage threshold was exceeded.

What is claimed is:

1. An electronic unit for detecting a charge condition and/or wear of a motor vehicle battery, comprising:

a battery voltage detector;

an internal-combustion engine rotational speed detector; and an evaluation unit receiving the battery voltage and the rotational speed of the internal-combustion engine and evaluating the battery voltage as a function of the rotational speed of the internal-combustion engine during a starting operation in order to detect the charge condition and/or wear of the motor vehicle battery;

wherein a voltage threshold as a function of the rotational speed of the internal-combustion engine is defined, said evaluating unit concluding a poor charge condition and/or or a high wear of the motor vehicle battery when the battery voltage within a defined time window is below the defined voltage threshold;

a quiescent voltage detector for detecting a quiescent voltage before a starting operation;

wherein said evaluating unit concludes there is a poor charge condition when the battery voltage during the starting operation is below the defined voltage threshold after the quiescent voltage previously fell-below a defined quiescent voltage threshold; and wherein the evaluation unit concludes there is a high wear when the battery voltage during the starting operation is below the defined voltage threshold after the quiescent voltage previously exceeded the defined quiescent voltage threshold.

2. A method for identifying a charge state and/or wear of a motor vehicle battery, the method comprising the acts of:

detecting a battery voltage of the motor vehicle battery;

detecting a rotational speed of an internal-combustion engine;

detecting a quiescent voltage before a starting operation of the internal-combustion engine;

evaluating the battery voltage according to the rotational speed of the internal-combustion engine during a starting operation in relation to the charge state and/or wear of the motor vehicle battery; and wherein the act of evaluating further comprises the acts of:

defining a voltage threshold as a function of the rotational speed of the internal-combustion engine;

defining a quiescent voltage threshold; and concluding there is a poor charge condition when the battery voltage during the starting operation is below the defined voltage threshold after the quiescent voltage previously fell-below the defined quiescent voltage threshold; and concluding there is a high wear when the battery voltage during the starting operation is below the defined voltage threshold after the quiescent voltage previously exceeded the defined quiescent voltage threshold.

* * * * *